US005483151A

United States Patent [19]

Yamashita

[11] Patent Number: 5,483,151

[45] Date of Patent: Jan. 9, 1996

[54] VARIABLE CURRENT SOURCE FOR VARIABLY CONTROLLING AN OUTPUT CURRENT IN ACCORDANCE WITH A CONTROL VOLTAGE

[75] Inventor: Hiromitsu Yamashita, Hyogo, Japan

[73] Assignee: Mitsubishi Denki Kabushiki Kaisha, Tokyo, Japan

[21] Appl. No.: 312,624

[22] Filed: Sep. 27, 1994

[51] Int. Cl.[6] .................. G05F 3/04; G05F 3/16; H03K 3/01

[52] U.S. Cl. .................. 323/312; 323/315; 327/538

[58] Field of Search .................. 323/312, 315, 323/316, 317; 330/257, 288, 136; 327/63, 66, 530, 535, 538

[56] References Cited

U.S. PATENT DOCUMENTS

| | | | |
|---|---|---|---|
| 4,885,475 | 12/1989 | Farina | 323/312 |
| 5,196,742 | 3/1993 | McDonald | 327/65 |
| 5,252,866 | 10/1993 | Kimura | 327/63 |
| 5,343,163 | 8/1994 | Linder et al. | 330/252 |
| 5,373,253 | 12/1994 | Bailey et al. | 323/315 |
| 5,381,083 | 1/1995 | Inamori et al. | 327/538 |
| 5,391,981 | 2/1995 | Masson | 323/315 |

OTHER PUBLICATIONS

Bipolar and MOS Analog Integrated Circuit Design, Alan B. Grebene, pp. 437–443, 8.11. "Current Amplifiers: The Gilbert Gain Cell", New York, 1984.

*Primary Examiner*—Matthew V. Nguyen

*Attorney, Agent, or Firm*—Oblon, Spivak, McClelland, Maier & Neustadt

[57] ABSTRACT

In addition to a Gilbert amplifier 101 which includes transistors 1 to 4, a current mirror circuit 102 is disposed. The internal structure of a current supply block 103 is modified. The current supply block 103 linearly converts an externally supplied control voltage Vcont by linear voltage/current conversion and determines a collector current (of a current amount IB) of a transistor 47. The same amount (=IB) of current as this collector current is developed as a collector current of a transistor 42 of the current mirror circuit 102. A collector of the transistor 42 is connected to a current source 45 of the current supply block 103 and an emitter of the transistor 3. Hence, assuming that a current value of the current source 45 is Io, an emitter current IA flowing through the transistor 3 is determined as IA=Io–IB. As a result, an output current I1 of the transistor 1 which has its base connected to the emitter of the transistor 3 changes in proportion to the control voltage Vcont.

13 Claims, 9 Drawing Sheets

VARIABLE CURRENT SOURCE FOR VARIABLY CONTROLLING AN OUTPUT CURRENT IN ACCORDANCE WITH A CONTROL VOLTAGE

BACKGROUND OF THE INVENTION

1. Field of the Invention

The present invention relates to a variable current source which linearly changes a direct current or an alternate current in accordance with a control voltage which is supplied to an electronic circuit or the like from outside.

2. Description of the Background Art

Recent years have seen an increased need for rationalized manufacturing of electronic equipment such as a TV and a VCR. To meet this demand, more and more of manual adjustment of a variable resistor and other parts conventionally performed by a man are now replaced by unattended adjustment under the control of a microcontroller. In a manufacturing process controlled by a microcontroller, a digital control output of the microcontroller is converted by a D/A convertor or the like into a direct current control voltage which will control various circuits. However, it is difficult to fabricate such a variable current source which linearly changes a current in accordance with a control voltage and supplies the linearly changed current to a circuit to be controlled.

FIG. 7 is a circuitry diagram of a conventional variable current source. In FIG. 7, indicated at 1 and 2 are NPN bipolar transistors with their emitters connected in common to form a differential amplifier. Noted at 3 and 4 are NPN bipolar transistors which have their emitters connected to bases of the transistors 1 and 2, respectively. Bases of the transistors 3 and 4 are both connected to a voltage source 5 and collectors of the transistors 3 and 4 are both connected to a power source 30. A collector of the transistor 2 is also connected to the power source 30.

A collector of the transistor 1 is indicated at 6. Emitters of transistors 21 and 22 are connected to each other via resistors 23 and 24 and collectors of the transistors 21 and 22 are connected to emitters of the transistors 3 and 4, respectively, so as to form a differential amplifier.

Indicated at 25 is a constant current source which is connected between a common contact point of the resistors 23 and 24 and a ground, and indicated at 26 is a current source which is connected between the emitters of the transistors 1 and 2 and the ground. A voltage source which is connected to a base of the transistor 21 is noted at 27. A variable voltage source connected to a base of the transistor 22 is shown at 28. A current supply block 100 formed by the elements 21 to 27 supplies currents to the transistors 1 to 4. A Gilbert amplifier 101 formed by the elements 1 to 5 is generally known as an amplifier which determines the amounts of a current to be supplied to the transistors 1 and 2.

Now, operation of the variable current source of FIG. 7 will be described. Because of a voltage supplied by the variable voltage source 28, a current from the variable current source 25 is divided in the differential amplifier which is formed by the transistors 21 and 22 and the associated emitter resistors 23 and 24 so that emitter currents are supplied to the transistors 3 and 4. Here, assuming that collector currents flowing through the transistors 21 and 22 are IA and IB, respectively, resistances of the resistors 23 and 24 are both RE, a current value of the current source 25 is Io, voltage values of the voltage sources 27 and 28 are VA and VB, respectively, and a voltage across the differential amplifier is Vcont, $$\begin{aligned} Vcont &= VB - VA) \\ &= ((KT/q)\ln(IB/Is) + RE \times IB)) - \\ &\quad ((KT/q)\ln(IA/Is) + RE \times IA)) \\ &= (KT/q)\ln(IB/IA) + RE(IB - IA) \end{aligned} \tag{1}$$

$$Io = IB + IA \tag{2}$$

where K is a Boltzmann's coefficient, T is an absolute temperature and q is an electrical charge.

Thus, the emitter currents into the transistors 3 and 4 are IA and IB, respectively. If base-emitter forward voltages are VBE3 and VBE4, respectively, $$VBE3=(KT/q)ln(IA/Is) \tag{3}$$

$$VBE4=(KT/q)ln(IB/Is) \tag{4}$$

A voltage $\alpha V$ impressed upon the differential amplifier which is formed by the transistors 1 and 2 is:

$$\begin{aligned} \Delta V &= VBE4 - VBE3 \\ &= (KT/q)\ln(IB/IA) \end{aligned} \tag{5}$$

Hence, if the collector currents in the transistors 1 and 2 are I1 and I2, respectively, a ratio I1/I2 is determined by:

$$\begin{aligned} I1/I2 &= \exp(q\Delta V/KT) \\ &= IB/IA \end{aligned} \tag{6}$$

That is, where a current generated in the current source 26 is IE, the output current I1 is determined by:

$$\begin{aligned} I1 &= IB/IA \times I2 = IB/IA(IE - I1) \\ \therefore\ I1 &= IE/(1 + IA/IB) \end{aligned} \tag{7}$$

Thus, due to the control voltage Vcont, a current is divided into the collector currents which flow through the transistors 1 and 2 at the same ratio as that determined by Eq. 1 regarding the currents IA and IB.

Here, for example, if (KT/q) 1n (IB/IA)$\ll$RE |(IB–IA)|in Eq. 1, Eq. 1 can be simplified as:

$$Vcont=RE(IB-IA) \tag{8}$$

Hence, from Eqs. 2 and 8, $$IB/IA=(IoRE+Vcont)/(IoRE-Vcont) \tag{9}$$

Therefore, from Eqs. 5 and 8, $$I1/I2=(IoRE+Vcont)/(IoRE-Vcont) \tag{10}$$

The current I1 available from an output 6 which is connected to the collector of the transistor 1 is expressed by Eq. 11 from Eqs. 2 and 6.

$$I1=IE/2(1+Vcont/IoRE) \tag{11}$$

Eq. 11 shows that the collector current I1 is in proportion to the control voltage Vcont when (KT/q) 1n (IB/IA)$\ll$|RE (IB–IA)|.

Having such a structure as above, the conventional variable current source creates the variable current I1 which is proportion to the control voltage Vcont when (KT/q) 1n (IB/IA)$\ll$|RE (IB–IA)|. However, in a graph plotting a control characteristic of the conventional variable current source, a control curve becomes less linear where this condition is not satisfied.

FIG. 8 shows an example of a control characteristic of the conventional variable current source. As can be seen in FIG. 8, a curve L1 expressing a change in the output current I1 created by the conventional variable current source in accordance with the control voltage Vcont exhibits an excellent linearity in a section A1 of the graph where the condition (KT/q) 1n (IB/IA)<<|RE (IB–IA)| is satisfied. However, in the other sections of the graph, the curve L1 is deviated from an ideal control curve L0.

The deteriorated linearity of the control curve is a problem. For instance, in a case as that shown in FIG. 9 where the brightness of a television screen is controlled by changing direct current bias voltages on outputs R, G and B of a television receiver by means of a variable current source, if the control area differs between the outputs R, G and B, the color phase on the screen will be shifted with a change in the brightness.

As shown in FIG. 9, video signals R, G and B amplified by a video amplifier 71 are clamped by voltages VCR, VCG and VCB at an R-clamp circuit 72R, a G-clamp circuit 72G and a B-clamp circuit 72B, respectively, and then applied on an electron gun of a CRT 73. By increasing or decreasing the clamp voltages VCR, VCG and VCB, the brightness of the screen brightened by the CRT 73 is adjusted.

The outputs R, G and B of the CRT 73 have different luminous efficacies. To deal with this, during manufacturing, different brightness voltages are used for R, G and B so that supply currents IR, IG and IB from variable current sources 74R, 74G and 74B which are respectively connected to the clamp circuits 72R, 72G and 72B are different from each other. With the supply currents IR, IG and 1B having different values from each other, clamp voltages are developed at load resistors RR, RG and RB and supplied to the clamp circuits. Thus, the clamp voltages are adjusted appropriately, whereby resulting white light has a proper phase.

A problem occurs when a user changes the brightness of the screen by further changing the brightness voltages. To change the brightness voltages, it is necessary to change control voltages VcontR, VcontG and VcontB for the variable current sources 74R, 74G and 74B, respectively. Here, if the control voltages VcontR, VcontG and VcontB are changed in an area where the linearity of the control curve is poor, a balance between R, G and B will be deteriorated and resulting white light will have an improper phase.

SUMMARY OF THE INVENTION

The present invention is directed to a variable current source for variably controlling an output current in accordance with a control voltage which is externally supplied. The variable current source comprises a differential amplifier which is formed by first and second transistors which have one electrodes connected to each other, the output current being a current which flows through other electrode of either one of the first and the second transistors; a third transistor having one electrode connected to a control electrode of the first transistor, another electrode connected to a power source and a control electrode to receive a constant voltage; a fourth transistor having one electrode connected to a control electrode of the second transistor and a control electrode to receive the constant voltage; first reference current supply means which is connected commonly to the one electrodes of the first and the second transistors, the first reference current supply means supplying a first reference current from the one electrodes of the first and the second transistors to a ground level; second reference current supply means which is connected to the one electrode of the third transistor, the second reference current supply means supplying a second reference current from the one electrode of the third transistor to the ground level; control current supply means which is connected to the one electrode of the fourth transistor, the control current supply means internally including voltage/current conversion means, the control current supply means receiving the control voltage so that the voltage/current conversion means converts the control voltage by linear voltage/current conversion into a control current, the control current supply means supplying the control current from the one electrode of the fourth transistor to the ground level; and a current mirror circuit for supplying a third reference current having the same current amount as the control current from a power source level to the one electrode of the third transistor.

Thus, according to the present invention, the control current supply means linearly converts the control voltage into the control current by linear voltage/current conversion performed by the voltage/current conversion means which is disposed within the control current supply means.

The current mirror circuit supplies the third reference current which has the same current amount as this control current from the power source level toward the one electrode of the third transistor.

Hence, a current flows from the one electrode of the third transistor toward the ground level having a value obtained by subtracting the control current from the second reference current.

As a result, the output current becomes proportional to the control voltage only if the current amount of the second reference current exceeds that of the control current. This makes it possible to supply an output current which exhibits an excellent linearity in a wide control area in accordance with a control voltage.

Accordingly, it is an object of the present invention to obtain a variable current source which supplies a current which exhibits an excellent linearity in a wide control area in accordance with a control voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
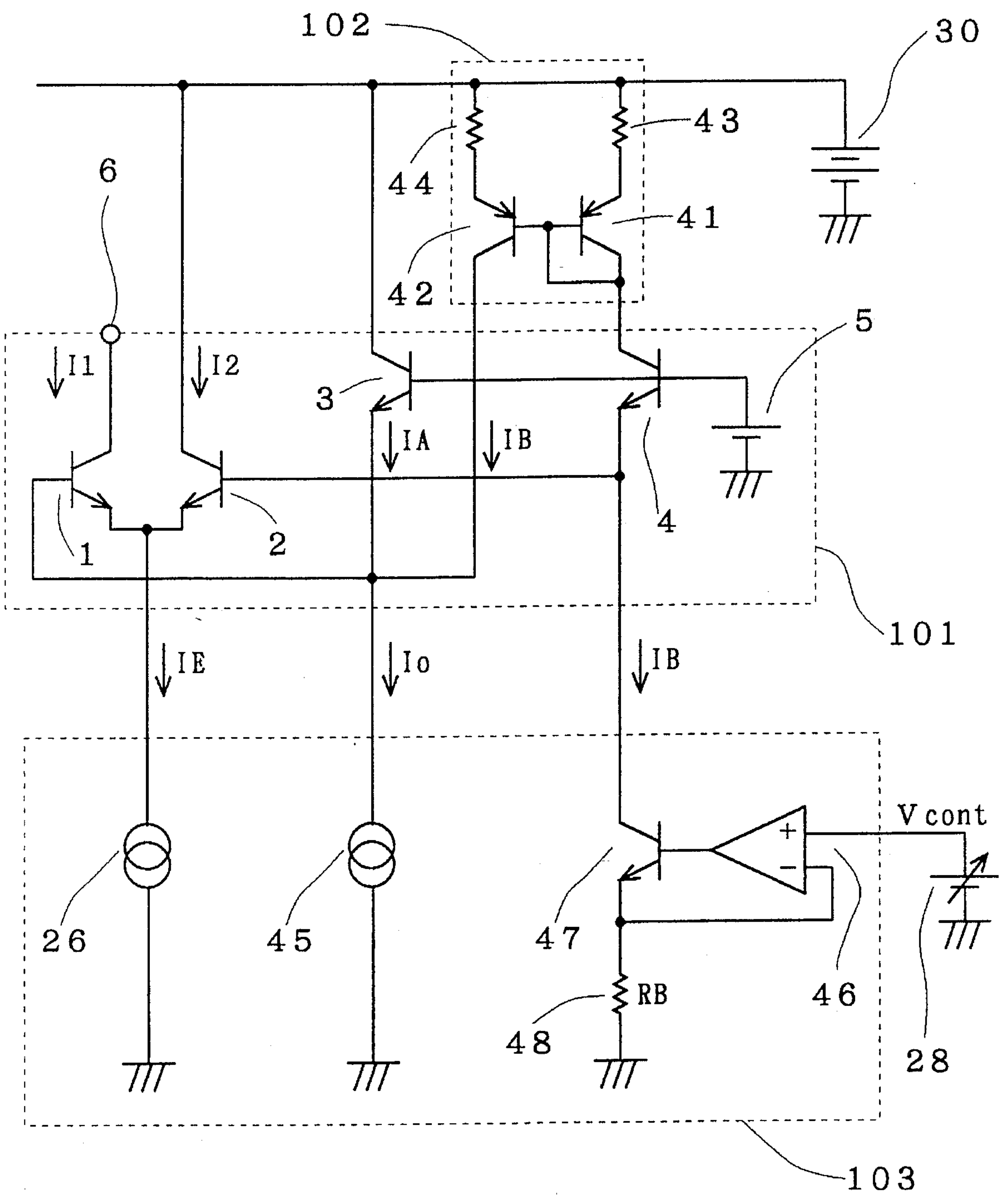
FIG. 1 is a circuitry diagram of a variable current source according to a first preferred embodiment of the present invention.

FIG. 1 is a circuitry diagram of a variable current source according to a first preferred embodiment of the present invention.

Figure 7:
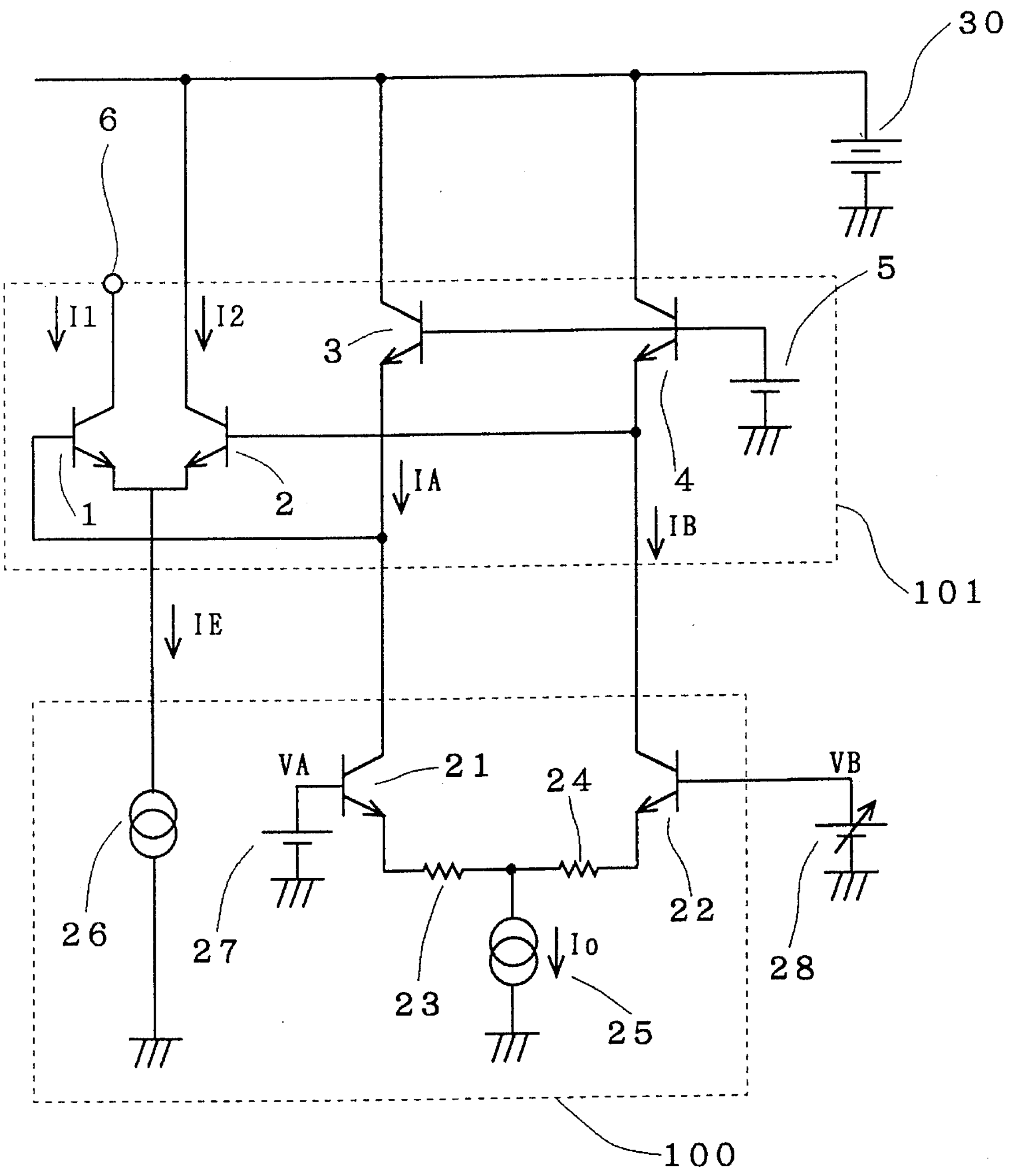
FIG. 7 (BACKGROUND ART)
FIG. 7 is a circuitry diagram showing a structure of a conventional variable current source.
Figure 8:
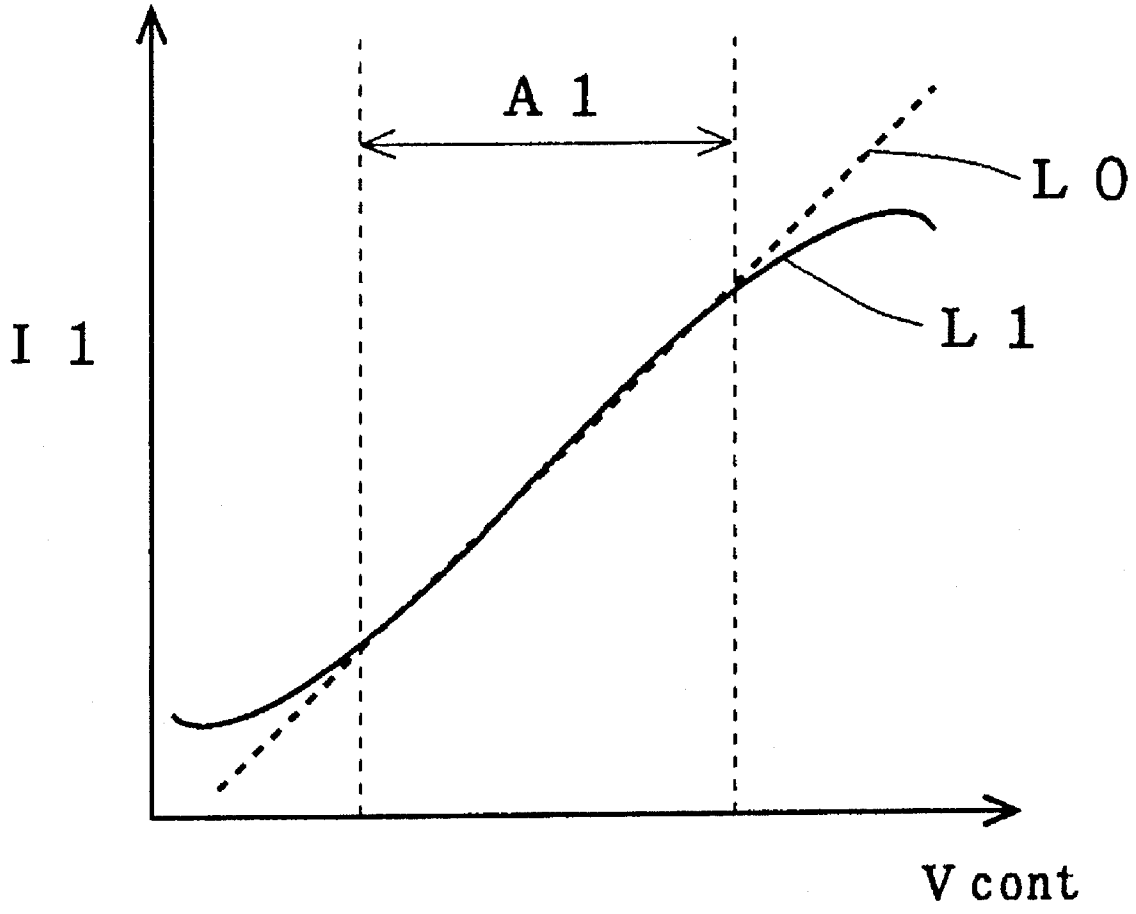
FIG. 8 (BACKGROUND ART)
FIG. 8 is a graph plotting a change in an output current which is created by the conventional variable current source against a control voltage.
Figure 9:
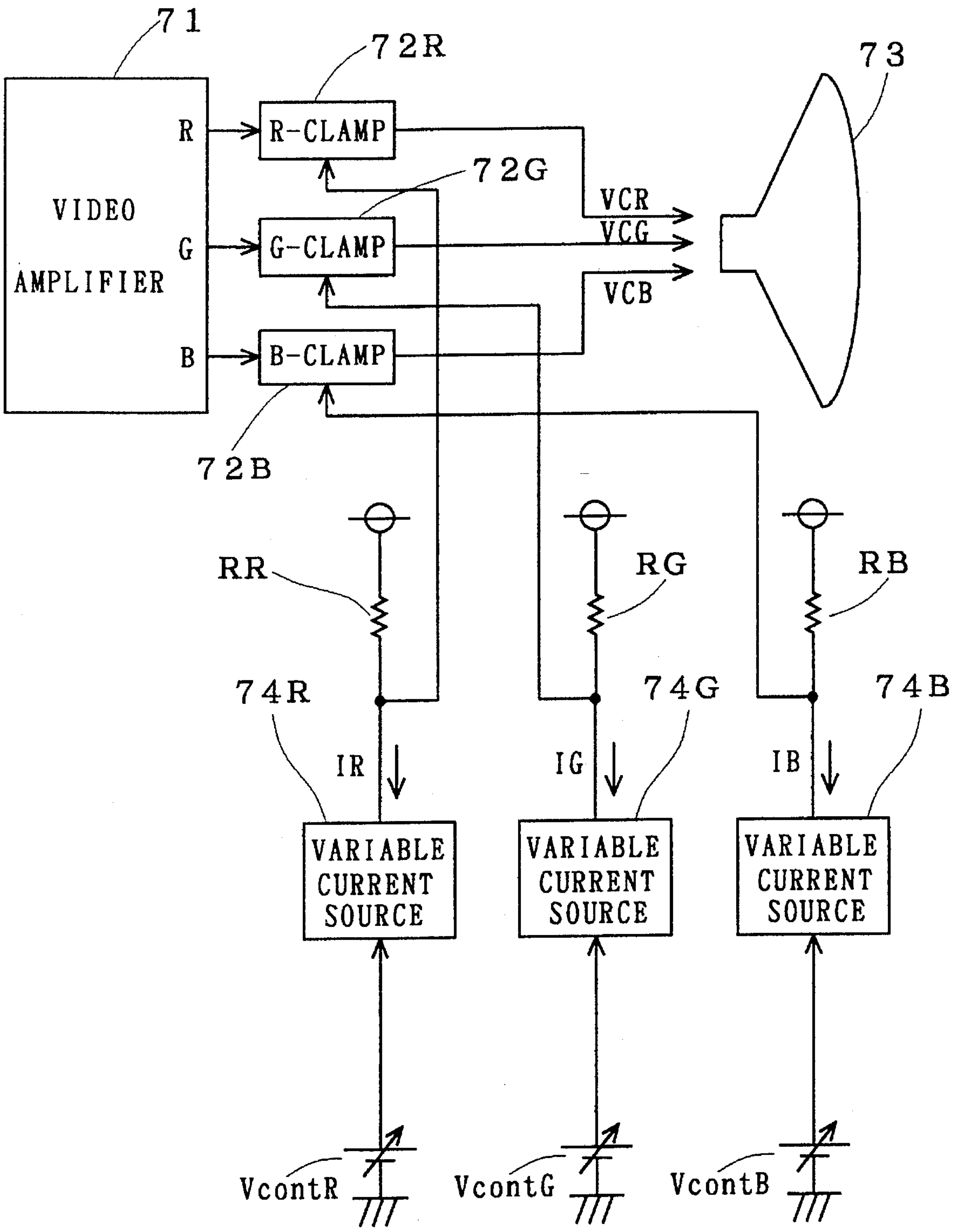
FIG. 9 is an explanatory diagram showing a television receiver to which a variable current source is applicable.

As compared with the conventional variable current source of FIG. 7, a Gilbert amplifier 101 of the variable current source of the first preferred embodiment is the same as that of the conventional variable current source. A difference from the conventional variable current source is that a current mirror circuit 102 is newly disposed and that the internal structure of a current supply block 103 is designed different from that of the current supply block 100. As in the conventional variable current source, the Gilbert amplifier 101 is formed by the transistors 1 to 4 and the voltage source 5.

The current mirror circuit 102 is formed by PNP bipolar transistors 41 and 42 and resistors 43 and 44. A collector and a base of the transistor 41 are commonly connected to the collector of the transistor 4 of the Gilbert amplifier 101. The transistor 42 has its base connected to the base of the transistor 41 and its collector connected to the emitter of the transistor 3 of the Gilbert amplifier 101. The resistor 43 is connected between an emitter of the transistor 41 and the power source 30 while the resistor 44 is connected between an emitter of the transistor 42 and the power source 30. Being the same as in the conventional variable current source, the internal structure of the Gilbert amplifier 101 will not be described here.

On the other hand, the current supply block 103 is formed by the current source 26, a current source 45, an operational amplifier 46, an NPN bipolar transistor 47 and a resistor 48. As in the conventional variable current source, the current source 26 is connected to the emitters of the transistors 1 and 2. The current source 45 is connected to the emitter of the transistor 3. The operational amplifier 46 has its plus input connected to an external control voltage source 28. The transistor 47 has its base connected to an output of the operational amplifier 46, its collector connected to the emitter of the transistor 4 and its emitter connected to a minus input of the operational amplifier 46. The resistor 48 is inserted between the emitter of the transistor 47 and the ground.

Now, operations of the variable current source of the first preferred embodiment will be described.

The control voltage Vcont available from the external control voltage source 28 is supplied to the plus input of the operational amplifier 46. Since there is a feedback from the emitter of the transistor 47 which has its base coupled to the output of the operational amplifier 46 into the minus input of the operational amplifier 46, the voltage Vcont appears at the emitter of the transistor 47 to be thereafter converted into a current by the resistor 48. If the resistance of the resistor 48 is RB, the current IB flowing the resistor 48 is determined by:

$$IB=Vcont/RB \qquad (12)$$

Since an emitter current and a collector current are approximately equal to each other if a gain hFE of a transistor is sufficiently high, the current IB flowing the resistor 48 flows into the emitter of the transistor 4 and becomes equal to the collector current of the transistor 4.

The base-emitter VBE4 of the transistor 4 is expressed as:

$$VBE4=(KT/q)ln(IB/Is) \qquad (13)$$

Meanwhile, the current mirror circuit 102 which is formed by the transistors 41 and 42 and the resistors 43 and 44 passes the same amount of current as the collector current of the transistor 4 toward the current source 45 as a collector current of the transistor 42.

Assuming that the current value of the current source 45 is Io, the emitter current IA of the transistor 3 is determined by:

$$IA=Io-IB \qquad (14)$$

The base-emitter VBE3 of the transistor 3 is expressed as:

$$VBE3=(KT/q)ln(IA/Is) \qquad (15)$$

Here, substituting Eq. 14 in Eq. 7, $$\begin{aligned} I1 &= IE/(1+IA/IB) \\ &= IE/(1+(Io-IB)/IB) \\ &= (IE/Io)IB \end{aligned} \qquad (16)$$

Hence, by substituting Eq. 12 in Eq. 16, $$I1=(IE/Io\cdot RB)Vcont \qquad (17)$$

As can be understood from Eq. 17, since the currents IE and Io and the resistance RB has fixed values, the output current I1 changes in proportion to the voltage Vcont. Further, there is no restraint on the control area at all as far as a condition IB<Io is satisfied.

Figure 2:
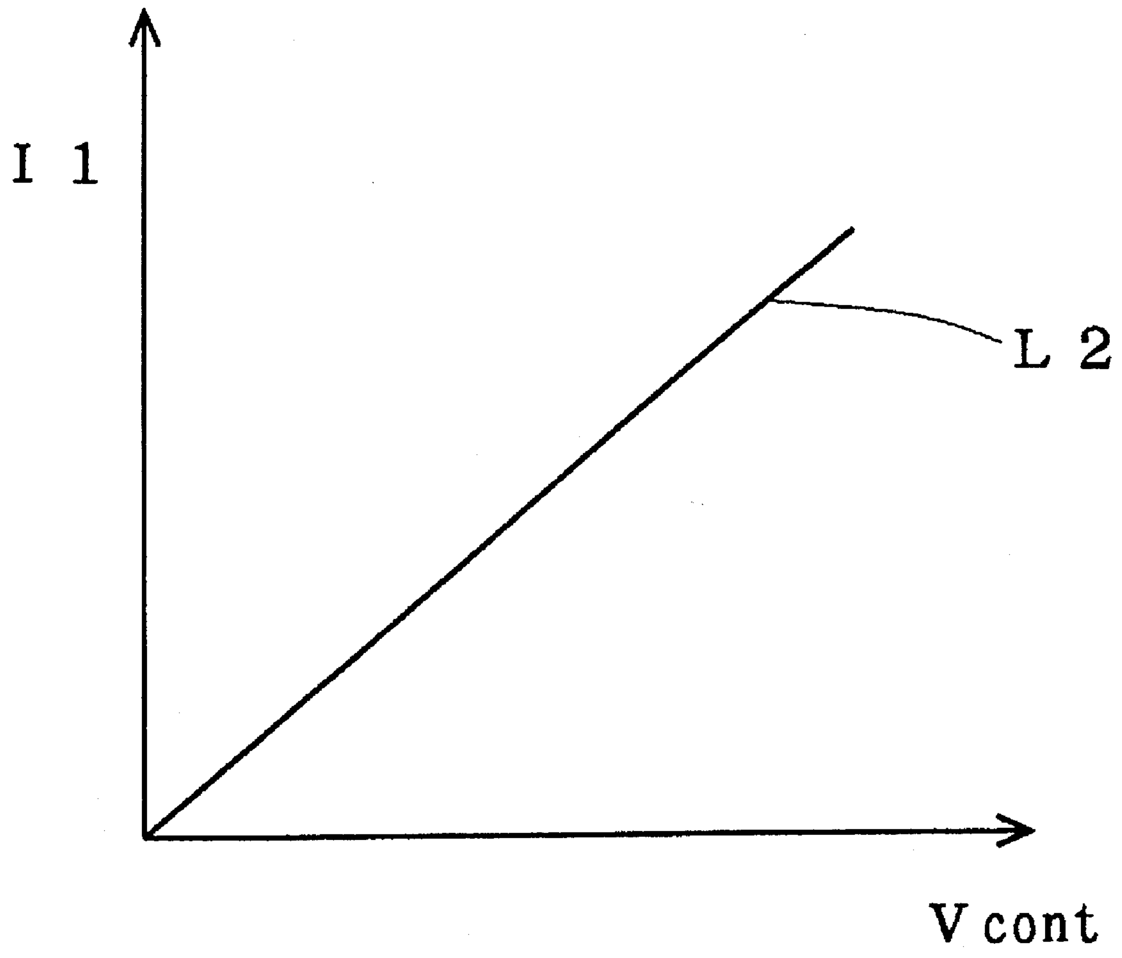
FIG. 2 is a graph plotting a change in an output current which is created by a variable current source against a control voltage.

FIG. 2 shows a control characteristic of the variable current source of the first preferred embodiment. As can be seen in FIG. 2, plotted against the control voltage Vcont, a curve expressing a change in the output current I1 created by the variable current source of the first preferred embodiment exhibits an ideal linearity in all areas.

Thus, the variable current source of the first preferred embodiment supplies a current which has an excellent linearity in every control area in accordance with the control voltage.

<Second Preferred Embodiment>

Figure 3:
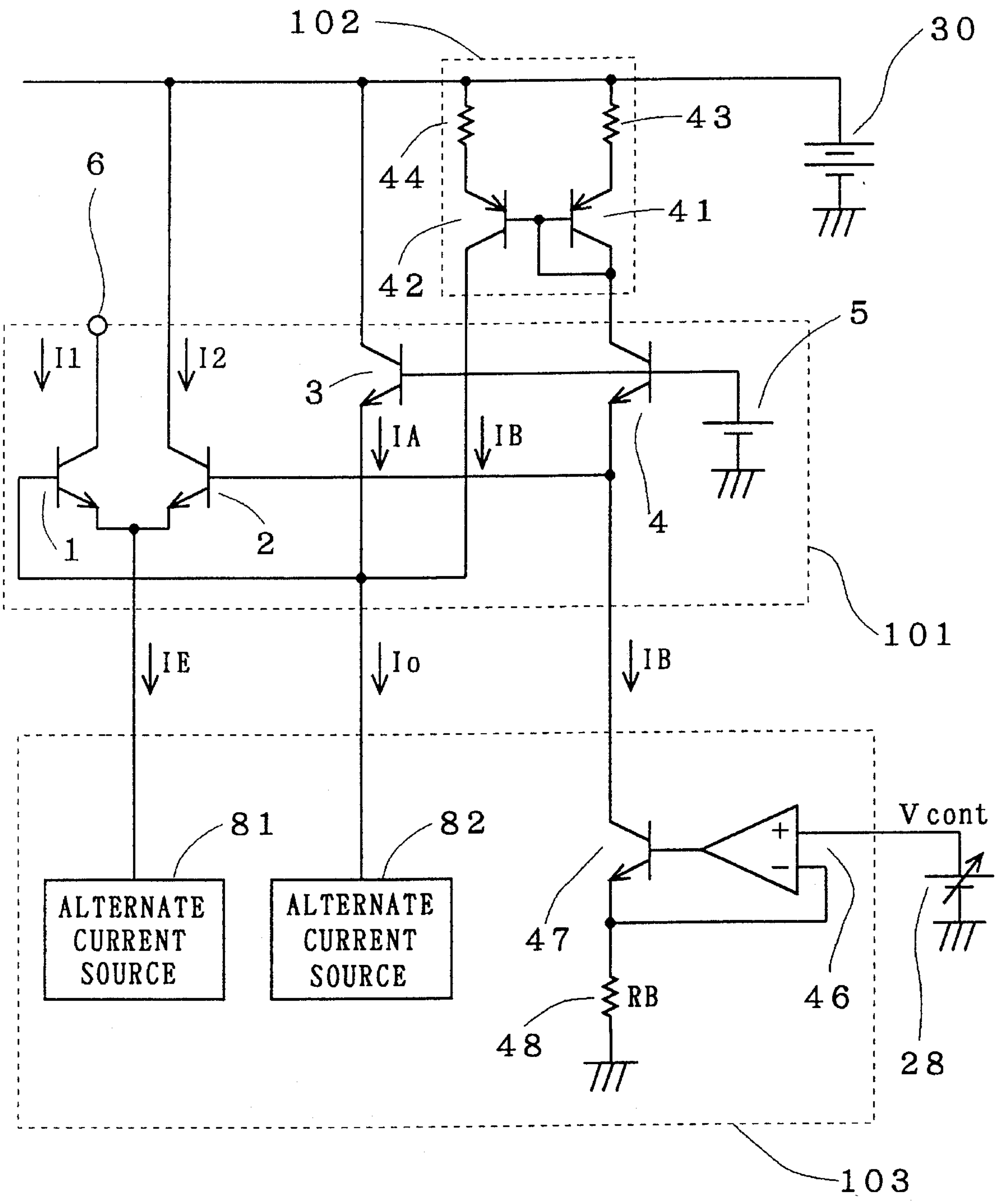
FIG. 3 is a circuitry diagram of a variable current source according to a second preferred embodiment of the present invention.

In the first preferred embodiment, the current source 26 is used as a source of a direct current. However, by replacing the current source 26 with an alternate current source 81 which supplies a signal as shown in FIG. 3, it is possible to use the variable current source as an attenuator which linearly attenuates a signal current in accordance with an external control voltage. Further, the current source 45 may be replaced with an alternate current source 82.

<Third Preferred Embodiment>

Figure 4:
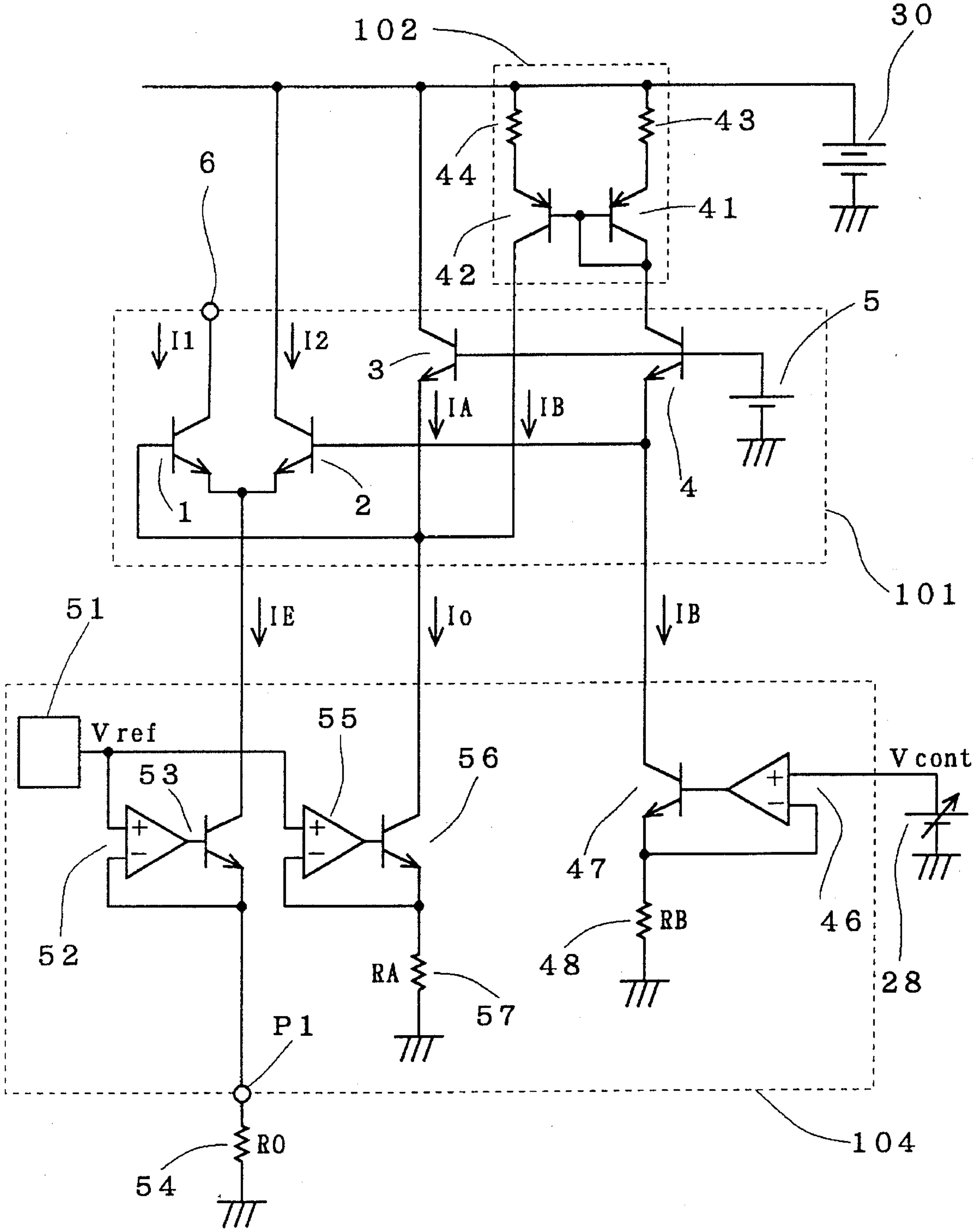
FIG. 4 is a circuitry diagram of a variable current source according to a third preferred embodiment of the present invention.

FIG. 4 is a circuitry diagram of a variable current source according to a third preferred embodiment of the present invention. As compared with the variable current source of FIG. 1 according to the first preferred embodiment, the Gilbert amplifier 101 and the current mirror circuit 102 of the variable current source of the third preferred embodiment are the same as those of the variable current source of the first preferred embodiment. A difference from the first preferred embodiment is that the internal structure of an integrated current supply block 104 is not the same as that of the current supply block 103.

The current supply block 104 includes a reference voltage source 51, operational amplifiers 52 and 55 each having their plus input connected to the voltage source 51, and NPN bipolar transistors 53 and 56 having their bases coupled to outputs of the operational amplifiers 52 and 55, respectively, and their emitters connected to minus inputs of the operational amplifiers 52 and 55, respectively. An emitter of the transistor 53 is connected to a terminal P1. Noted at 57 is a resistor (having a resistance of RA) which is connected between an emitter of the transistor 56 and the ground. An external resistor (having a resistance of Ro) is connected between the terminal P1 of the current supply block and the ground level.

Where the voltage source 51 creates a voltage Vref, this voltage Vref appears at the emitters of the transistors 53 and 56. It then follows that the emitter current IE of the transistor 53 is expressed as:

$$IE = Vref/Ro \tag{18}$$

The current Io is expressed as:

$$Io = Vref/RA \tag{19}$$

Hence, substituting Eqs. 18 and 19 in Eq. 17, $$\begin{aligned} I1 &= (IE/IoRB)Vcont \\ &= (Vref/Ro)/(VrefRB/RA) \times Vcont \\ &= (RA/RB)(Vcont/Ro) \end{aligned} \tag{20}$$

Here, if the resistors 57 and 48 respectively having the resistances of RA and RB are formed on the same semiconductor integrated circuit, for example, so that the temperature coefficients of the resistors 57 and 48 are equally $\alpha$, and if the temperature coefficient of the resistor 54 is zero, the output current I1 is determined by:

$$\begin{aligned} I1 &= (RAo(1+\alpha T)/RAo(1+\alpha T))(Vcont/Ro) \\ &= (RAo/RBo)(Vcont/Ro) \end{aligned} \tag{21}$$

where the symbols RAo and RBo denote the values of the resistances RA and RB, respectively, of when the temperature is zero, and the symbol T denotes the temperature.

As can be understood from Eq. 21, the output current I1 linearly changes in proportion to the control voltage Vcont independently of the output voltage Vref of the voltage source 51 the temperature coefficients of the resistors 57 and 48. Thus, it is possible to obtain the output current I1 when the temperature is zero.

It is also possible to change the temperature coefficient of the output current I1 as desired by changing the temperature coefficient of the resistor 54.

<Fourth Preferred Embodiment>

Figure 5:
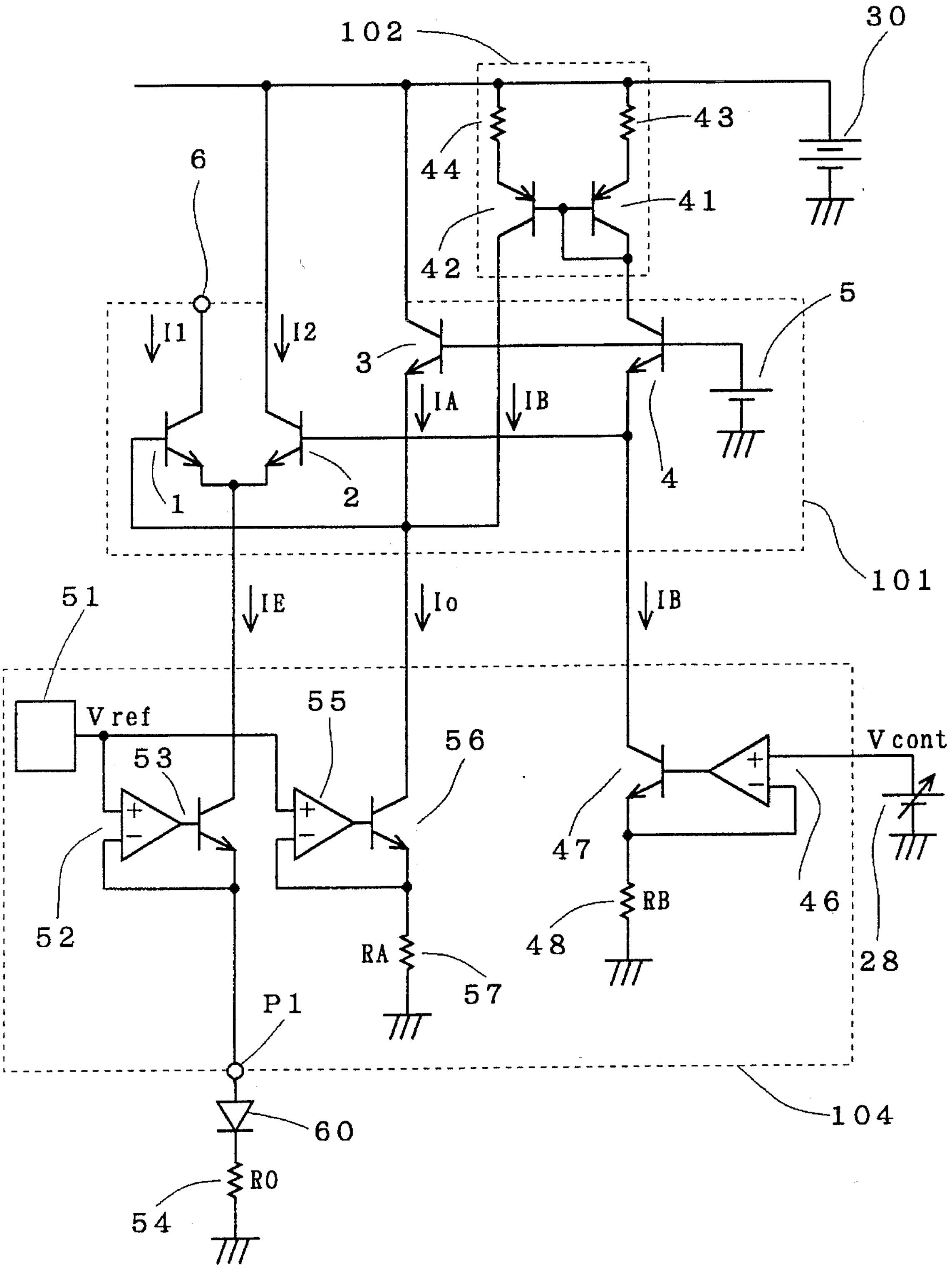
FIG. 5 is a circuitry diagram of a variable current source according to a fourth preferred embodiment of the present invention.

FIG. 5 shows a fourth preferred embodiment of the present invention wherein the temperature coefficient of the output current can be changed as desired by changing the temperature coefficient of the current which flows through the resistor 54. As shown in FIG. 5, an anode of a diode 60 is connected to the connection terminal P1 and the resistor 54 is disposed between the diode 60 and the ground level.

A regular resistor has a positive temperature coefficient. However, since a voltage at the diode has a negative temperature coefficient, by combining the diode 60 and the resistor 54 as shown in FIG. 5, the resistor 54 serves as if it is a resistor which has a negative temperature coefficient. Hence, it is possible to increase the emitter current IE by increasing the temperature of the resistor 54, for example.

<Fifth Preferred Embodiment>

Figure 6:
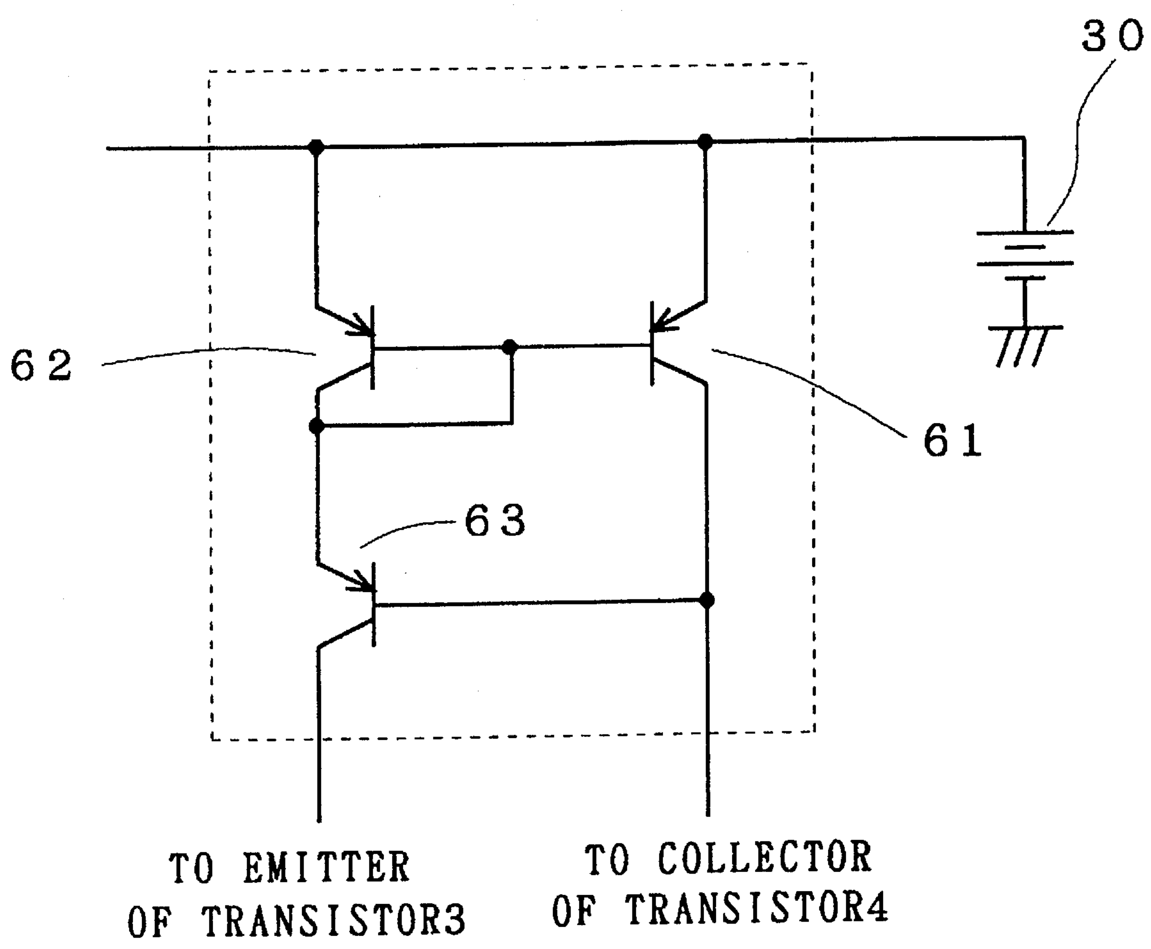
FIG. 6 is a circuitry diagram showing other example of a structure of a current mirror circuit which is included in a variable current source according to a fifth preferred embodiment of the present invention.

As the current mirror circuit 102, a Wilson mirror circuit as that shown in FIG. 6 may be used.

As shown in FIG. 6, the Wilson mirror circuit is formed by PNP bipolar transistors 61 to 63. Emitters of the transistors 61 and 62 are commonly connected to the power source 30. A collector and a base of the transistor 62 are connected in common. The collector of the transistor 62 is further connected to an emitter of the transistor 63. A base of the transistor 63 is connected to a collector of the transistor 61.

The collector of the transistor 61 is further connected to the collector of the transistor 4 of the Gilbert amplifier 101. A collector of the transistor 63 is connected to the emitter of the transistor 3 of the Gilbert amplifier 101.

Since a base-collector voltage of the transistor 61 is clamped by the transistor 63 in the Wilson mirror circuit having such a structure, as compared with the current mirror circuit 102 having the structure as that shown in FIG. 1, the Wilson mirror circuit more accurately supplies the same amount of current as the collector current of the transistor 61 as the collector current of the transistor 63.

Hence, if constructed to include the Wilson mirror circuit of FIG. 6 instead of the current mirror circuit 102, the variable current source supplies a current which exhibits an excellent linearity in every control area in accordance with the control voltage.

While the invention has been described in detail, the foregoing description is in all aspects illustrative and not restrictive. It is understood that numerous other modifications and variations can be devised without departing from the scope of the invention.

I claim:

1. A variable current source for variably controlling an output current in accordance with a control voltage which is externally supplied, comprising:

a differential amplifier which is formed by first and second transistors each having one electrode connected to each other at a common point, said output current being a current which flows through another electrode of either one of said first and second transistors;

a third transistor having one electrode connected to a control electrode of said first transistor, another electrode connected to a power source and a control electrode to receive a constant voltage;

a fourth transistor having one electrode connected to a control electrode of said second transistor and a control electrode to receive said constant voltage;

first reference current supply means which is connected to said common point, said first reference current supply means supplying a first reference current from said common point of said first and second transistors to a ground level;

second reference current supply means which is connected to said one electrode of said third transistor, said second reference current supply means supplying a second reference current from said one electrode of said third transistor to said ground level;

control current supply means which is connected to said one electrode of said fourth transistor, said control current supply means internally including voltage/current conversion means, said control current supply means receiving said control voltage so that said voltage/current conversion means converts said control voltage by linear voltage/current conversion into a control current, said control current supply means supplying said control current from said one electrode of said fourth transistor to said ground level; and a current mirror circuit for supplying a third reference current having the same current amount as said control current from a power source level to said one electrode of said third transistor.

2. The variable current source of claim 1, wherein said first reference current supply means includes second voltage/current conversion means so that a reference voltage supplied to said first reference current supply means is converted by said second voltage/current conversion means by linear voltage/current conversion into said first reference current, and wherein said second current supply means includes third voltage/current conversion means so that said reference voltage supplied to said second reference current supply means is converted by said third voltage/current conversion means by linear voltage/current conversion into said second reference current.

3. The variable current source of claim 2, wherein a temperature influence degree of said voltage/current conversion means which expresses the degree of influence of a temperature over a voltage/current conversion characteristic of said voltage/current conversion means is set the same as a temperature influence degree of said third voltage/current conversion means which expresses the degree of influence of a temperature over a voltage/current conversion characteristic of said third voltage/current conversion means.

4. The variable current source of claim 2, wherein said control current supply means includes:

an operational amplifier which receives said control voltage at a plus input of said operational amplifier;

a control resistor having one end connected to a minus input of said operational amplifier and another end connected to said ground level, said control resistor being said voltage/current conversion means, said control current being determined in accordance with a ratio of said control voltage to a resistance of said control resistor; and a fifth transistor having a control electrode connected to an output of said operational amplifier, one electrode connected to said one end of said control resistor and another electrode connected to said one electrode of said fourth transistor.

5. The variable current source of claim 4, wherein said first reference current supply means includes:

a second operational amplifier which receives said reference voltage at a plus input of said second operational amplifier;

a sixth transistor having a control electrode connected to an output of said second operational amplifier, one electrode connected to a minus input of said second operational amplifier and another electrode connected to said common point; and a first reference resistor part having one end connected to said one electrode of said sixth transistor and another end connected to said ground level, said first reference resistor part being said second voltage/current conversion means, said first reference current being determined in accordance with a ratio of said reference voltage to a resistance of said first reference resistor part, and wherein said second reference current supply means includes:

a third operational amplifier which receives said reference voltage at a plus input of said third operational amplifier;

a seventh transistor having a control electrode connected to an output of said third operational amplifier, one electrode connected to a minus input of said third operational amplifier and another electrode connected to said one electrode of said third transistor; and a second reference resistor part having one end connected to said one electrode of said seventh transistor and another end connected to said ground level, said second reference resistor part being said third voltage/current conversion means, said second reference current being determined in accordance with a ratio of said reference voltage to a resistance of said second reference resistor part.

6. The variable current source of claim 5, wherein temperature coefficients for determining resistances of said control resistor and said second reference resistor part are the same, a temperature coefficient for determining a resistance of said first reference resistor part can be set at any desired value, and wherein said temperature coefficients are said temperature influence degrees.

7. The variable current source of claim 6, wherein said first and said second reference current supply means and said control current supply means are integrated except for said first reference resistor part.

8. The variable current source of claim 7, wherein said first reference resistor part of said first reference current supply means includes a reference resistor which has one end connected to one electrode of said sixth transistor and another end grounded.

9. The variable current source of claim 7, wherein said first reference resistor part of said first reference current supply means includes:

a diode having an anode connected to one electrode of said sixth transistor; and a reference resistor which has one end connected to a cathode of said diode and another end grounded.

10. The variable current source of claim 1, wherein said first reference current supplied by said first reference current supply means is a constant direct current.

11. The variable current source of claim 1, wherein said first reference current supplied by said first reference current supply means is an alternate current.

12. The variable current source of claim 1, wherein said current mirror circuit is a Wilson mirror circuit.

13. The variable current source of claim 5, wherein said first to said seventh transistors are NPN bipolar transistors.

* * * * *